(12) United States Patent
Sun et al.

(10) Patent No.: US 9,899,578 B2
(45) Date of Patent: Feb. 20, 2018

(54) PROCESS FOR PREPARING A SEMICONDUCTOR STRUCTURE FOR MOUNTING

(71) Applicant: Lumileds LLC, San Jose, CA (US)

(72) Inventors: Decai Sun, Sunnyvale, CA (US);
Charlene Sun, Pleasanton, CA (US);
Oleg Shchekin, San Francisco, CA (US)

(73) Assignee: Lumileds LLC, San Jose, CA (US)

( * ) Notice: Subject to any disclaimer, the term of this patent is extended or adjusted under 35 U.S.C. 154(b) by 0 days.

(21) Appl. No.: 14/826,473

(22) Filed: Aug. 14, 2015

(65) Prior Publication Data

US 2015/0349217 A1    Dec. 3, 2015

Related U.S. Application Data

(63) Continuation of application No. 11/536,118, filed on Sep. 28, 2006, now Pat. No. 9,111,950.

(51) Int. Cl.
| | |
|---|---|
| *H01L 33/00* | (2010.01) |
| *H01L 33/08* | (2010.01) |
| *H01L 33/36* | (2010.01) |
| *H01L 33/38* | (2010.01) |
| *H01L 33/54* | (2010.01) |
| *H01L 33/62* | (2010.01) |
| *H01L 33/48* | (2010.01) |

(Continued)

(52) U.S. Cl.
CPC ........... *H01L 33/54* (2013.01); *H01L 21/563* (2013.01); *H01L 33/486* (2013.01); *H01L 33/62* (2013.01); *H01L 33/0079* (2013.01); *H01L 33/44* (2013.01); *H01L 33/52* (2013.01); *H01L 2224/73203* (2013.01); *H01L 2924/01079* (2013.01); *H01L 2933/005* (2013.01); *H01L 2933/0066* (2013.01)

(58) Field of Classification Search
CPC ..... H01L 33/0008; H01L 33/08; H01L 33/36; H01L 33/38; H01L 33/54; H01L 33/62
See application file for complete search history.

(56) References Cited

U.S. PATENT DOCUMENTS

| | | | | |
|---|---|---|---|---|
| 4,017,881 A | * | 4/1977 | Ono | ........................ H01L 33/00 148/DIG. 49 |
| 4,183,039 A | * | 1/1980 | Aoki | ................... H01L 33/0008 257/101 |

(Continued)

FOREIGN PATENT DOCUMENTS

| | | |
|---|---|---|
| DE | 10163799 A1 | 7/2002 |
| JP | 57-045583 A2 | 3/1982 |

(Continued)

OTHER PUBLICATIONS

CN Office Action, Application 201510220154.6, LUM reference 2006P02596CN, Dec. 16, 2016, 24 pps.

(Continued)

*Primary Examiner* — David Zarneke
(74) *Attorney, Agent, or Firm* — Volpe and Koenig, P.C.

(57) ABSTRACT

A process for preparing a semiconductor structure for mounting to a carrier is disclosed. The process involves causing a support material to substantially fill a void defined by surfaces formed in the semiconductor structure and causing the support material to solidify sufficiently to support the semiconductor structure when mounted to the carrier.

18 Claims, 9 Drawing Sheets

(51) Int. Cl.
*H01L 21/56* (2006.01)
*H01L 33/52* (2010.01)
*H01L 33/44* (2010.01)

(56) References Cited

U.S. PATENT DOCUMENTS

| | | | |
|---|---|---|---|
| 5,563,422 A | 10/1996 | Nakamura | |
| 5,621,225 A | 4/1997 | Shieh et al. | |
| 6,168,972 B1 | 1/2001 | Wang et al. | |
| 6,194,788 B1 | 2/2001 | Gilleo et al. | |
| 6,212,689 B1 | 4/2001 | Lee | |
| 6,228,678 B1 | 5/2001 | Gilleo et al. | |
| 6,245,595 B1 | 6/2001 | Nguyen et al. | |
| 6,258,625 B1 | 7/2001 | Brofman et al. | |
| 6,260,264 B1 | 7/2001 | Chen et al. | |
| 6,331,450 B1 * | 12/2001 | Uemura | H01L 23/3107 228/180.22 |
| 6,333,206 B1 | 12/2001 | Ito et al. | |
| 6,399,426 B1 | 6/2002 | Capote et al. | |
| 6,455,878 B1 | 9/2002 | Bhat | |
| 6,476,501 B1 | 11/2002 | Ohuchi | |
| 6,504,241 B1 | 1/2003 | Yanagida | |
| 6,506,681 B2 | 1/2003 | Grigg et al. | |
| 6,514,782 B1 * | 2/2003 | Wierer, Jr. | H01L 25/0753 257/13 |
| 6,521,914 B2 * | 2/2003 | Krames | H01L 33/38 257/81 |
| 6,551,863 B2 | 4/2003 | Johnson et al. | |
| 6,555,414 B1 | 4/2003 | Vanfleteren et al. | |
| 6,573,122 B2 | 6/2003 | Standing | |
| 6,573,537 B1 * | 6/2003 | Steigerwald | H01L 25/0753 257/103 |
| 6,576,495 B1 | 6/2003 | Jiang et al. | |
| 6,642,072 B2 | 11/2003 | Inoue | |
| 6,649,445 B1 | 11/2003 | Qi et al. | |
| 6,649,941 B2 | 11/2003 | Uemura | |
| 6,713,844 B2 | 3/2004 | Tatsuta et al. | |
| 6,730,542 B2 | 5/2004 | Wang et al. | |
| 6,746,896 B1 | 6/2004 | Shi | |
| 6,770,510 B1 | 8/2004 | Su | |
| 6,773,958 B1 | 8/2004 | Wang | |
| 6,794,751 B2 | 9/2004 | Kumamoto | |
| 6,812,502 B1 | 11/2004 | Chien | |
| 6,828,596 B2 | 12/2004 | Steigerwald et al. | |
| 6,878,973 B2 | 4/2005 | Lowery et al. | |
| 6,893,904 B2 | 5/2005 | Akram | |
| 6,908,784 B1 | 6/2005 | Farnworth et al. | |
| 6,909,194 B2 | 6/2005 | Farnworth et al. | |
| 6,916,684 B2 | 7/2005 | Stepniak et al. | |
| 7,205,117 B1 | 4/2007 | Robertson et al. | |
| 7,304,326 B2 | 12/2007 | Suehiro et al. | |
| 7,402,461 B2 | 7/2008 | Mizukoshi et al. | |
| 7,514,295 B2 | 4/2009 | Mizukoshi et al. | |
| 7,535,028 B2 | 5/2009 | Fan | |
| 7,582,905 B2 | 9/2009 | Tamura | |
| 7,754,550 B2 | 7/2010 | Chiola et al. | |
| 8,148,183 B2 * | 4/2012 | Hamasaki | H01L 33/0095 257/E21.502 |
| 8,541,797 B2 | 9/2013 | Hoelen et al. | |
| 8,610,163 B2 * | 12/2013 | Hamasaki | H01L 33/0095 257/98 |
| 8,643,029 B2 * | 2/2014 | Lee | H01L 27/153 257/778 |
| 8,852,976 B2 * | 10/2014 | Hamasaki | H01L 33/0095 257/98 |
| 8,860,075 B2 * | 10/2014 | Izuka | H01L 33/38 257/750 |
| 8,933,476 B2 * | 1/2015 | Akimoto | H01L 33/44 257/91 |
| 9,178,118 B2 * | 11/2015 | Akimoto | H01L 33/44 |
| 9,202,992 B2 * | 12/2015 | Tomizawa | H01L 33/44 |
| 2002/0092610 A1 | 7/2002 | Funaya et al. | |
| 2003/0183947 A1 | 10/2003 | Ohuchi | |
| 2004/0222735 A1 | 11/2004 | Ragle | |
| 2005/0023550 A1 | 2/2005 | Eliashevich et al. | |
| 2005/0028361 A1 | 2/2005 | Yin et al. | |
| 2005/0056855 A1 * | 3/2005 | Lin | H01L 33/382 257/98 |
| 2005/0056933 A1 | 3/2005 | Chung | |
| 2005/0194605 A1 * | 9/2005 | Shelton | H01L 33/62 257/99 |
| 2005/0254243 A1 | 11/2005 | Jiang et al. | |
| 2006/0091409 A1 | 5/2006 | Epler et al. | |
| 2006/0138443 A1 * | 6/2006 | Fan | H01L 33/56 257/100 |
| 2006/0202225 A1 * | 9/2006 | Kim | H01L 25/167 257/99 |
| 2006/0281203 A1 | 12/2006 | Epler et al. | |
| 2007/0096130 A1 | 5/2007 | Schiaffino et al. | |
| 2007/0121690 A1 | 5/2007 | Fujii et al. | |
| 2009/0159902 A1 * | 6/2009 | Yasuda | H01L 33/08 257/88 |

FOREIGN PATENT DOCUMENTS

| | | |
|---|---|---|
| JP | 10-012932 | 1/1998 |
| JP | 11150298 | 6/1999 |
| JP | 2000138260 A | 5/2000 |
| JP | 2000244012 A | 9/2000 |
| JP | 2002094128 A | 3/2002 |
| JP | 2004006771 A | 1/2004 |
| JP | 2004172160 A | 6/2004 |
| JP | 2004363343 A | 12/2004 |
| JP | 2005051225 A | 2/2005 |
| JP | 2005252219 A | 9/2005 |
| JP | 2008521236 A | 6/2008 |

OTHER PUBLICATIONS

94(3) EPC dated May 31, 2010, European Application No. 07826570.9-2203, 6 pages.
Article 94(3) EPC dated Jan. 27, 2016, European Application No. 07826570.9-1552, 5 pages.
Decision of Rejection issued Mar. 15, 2013, China Application No. 200780026460.8, 19 pages.
EPO as ISA, PCT/IB2007/053936 filed Sep. 27, 2007, "International Search Report and Written Opinion" dated Apr. 1, 2008, 15 pages.
First Office Action dated May 12, 2010, China Application No. 200780036460.8, 13 pages.
Fourth Office Action dated Sep. 11, 2012, China Application No. 200780036460.8, 18 pages.
Notice of Reexamination dated Jun. 24, 2014, China Application No. 200780036460.8, 19 pages.
Notice of Reexamination dated Sep. 25, 2014, China Application No. 200780036460.8, 21 pages.
Office Action Decision dated Nov. 29, 2013, Taiwan Application No. 096135987, 5 pages.
Office Action dated Jun. 10, 2013, Japan Application No. 2007-279598, 4 pages.
Office Action dated Aug. 15, 2013, Taiwan Application No. 096135987, 14 pages.
Office Action dated Jul. 17, 2012, Japan Application No. 2007-279598, 6 pages.
Preliminary Rejection dated Oct. 8, 2013, Korean Patent Application No. 10-2009-7008731, 9 pages.
Reexamination Decision dated Jan. 20, 2015, China Application No. 20780036460.8, 34 pages.
Second Office Action dated Nov. 16, 2011, China Application No. 200780036460.8, 18 pages.
Second Preliminary Rejection dated May 22, 2014, Korean Patent Application No. 10-2009-7008731, 9 pages.
Third Office Action dated Apr. 20, 2012, China Application No. 200780036460.8, 17 pages.

* cited by examiner

PROCESS FOR PREPARING A SEMICONDUCTOR STRUCTURE FOR MOUNTING

The present application is a continuation of U.S. patent application Ser. No. 11/536,118, filed Sep. 28, 2006, and titled "Process for Preparing a Semiconductor Structure for Mounting", which issued as U.S. Pat. No. 9,111,950 on Aug. 18, 2015, and is incorporated herein by reference.

BACKGROUND OF THE INVENTION

1. Field of Invention

This invention relates generally to semiconductor devices, and more specifically to processing a semiconductor light-emitting structure for mounting.

2. Description of Related Art

Semiconductor light-emitting devices such as light-emitting diodes (LED's) provide efficient sources of light and are more robust than incandescent light bulbs and fluorescent tubes. Advancements in LED technology and processing have facilitated the use of such devices as replacements for traditional lighting sources in commercial and residential lighting applications, for example.

It is common practice when mounting semiconductor structures, to underfill gaps between the semiconductor structure and the carrier using an underfill material. The underfill material may be a material, such as an epoxy, which has weak internal or cohesive bonds, and thus has a strong tendency to wet other surfaces, particularly surfaces having a high surface energy. Many materials used for semiconductor mounting surfaces have a high surface energy in comparison with the underfill material, which causes the underfill to wick into gaps, aided by capillary attraction forces. The underfill material is then allowed to cure, thus providing enhanced structural integrity for the device.

A problem may occur in attempting to underfill semiconductor structures having voids using capillary underfilling methods, particularly where the structure has trenches or vias. Many underfill materials do not have low enough viscosity to completely wick into the voids, thus leaving some unfilled gaps therein. Such materials also have a tendency to fill in unintended areas, such as the sidewalls of the device. In some instances an underfill fillet may have to be removed from the sidewalls of the device to facilitate further processing, such as removal of the substrate, for example.

SUMMARY OF THE INVENTION

In accordance with one aspect of the invention there is provided a process for preparing a semiconductor structure for mounting to a carrier. The process involves causing a support material to substantially fill a void defined by surfaces formed in the semiconductor structure and causing the support material to solidify sufficiently to support the semiconductor structure when mounted to the carrier.

Causing the support material to substantially fill the void may involve causing a support material, which when solidified has a glass transition temperature greater than an operating temperature of the semiconductor structure, to substantially fill the void.

Causing the support material to substantially fill the void may involve causing a support material, which when solidified has a glass transition temperature of at least 195 degrees Celsius, to substantially fill the void.

Causing the support material to fill the void may involve causing a support material to at least partially overfill the void and further comprising planarizing the semiconductor structure such that an outer surface of the support material is substantially co-planar with an outer surface of the semiconductor structure.

Planarizing may involve at least one of lapping the outer surfaces of the semiconductor structure and the support material, polishing the outer surfaces of the semiconductor structure and the support material, and plasma etching the outer surfaces of the semiconductor structure and the support material.

Causing the support material to substantially fill the void may involve causing the support material to substantially fill voids in a plurality of semiconductor structures located on a semiconductor wafer.

Causing the support material to substantially fill the void may involve at least one of causing the support material to substantially fill a via formed between regions of the semiconductor structure, the via facilitating electrical connection to the regions of the semiconductor structure and causing the support material to substantially fill an insulating trench formed in the semiconductor structure, the insulating trench being operable to electrically insulate portions of the semiconductor structure to facilitate electrical connection thereto.

Causing the support material to substantially fill the void may involve spin coating the support material on the semiconductor structure.

The process may involve curing the support material.

Curing may involve at least one of causing a solvent in the support material to evaporate, thus at least partially solidifying the support material, and heating the semiconductor structure to a temperature sufficient to cause the support material to at least partially solidify.

Causing the support material to substantially fill the void may involve causing a support material that further acts as a passivation layer to substantially fill the void, the passivation layer being operable to prevent contamination of the semiconductor structure during subsequent processing.

The semiconductor structure may be configured to emit light at a first wavelength and causing the support material to substantially fill the void may involve causing a support material that is resistant to degradation by exposure to light of the first wavelength to substantially fill the void.

Causing the support material to substantially fill the void may involve causing a support material comprising one of a polyimide material, a benzocyclobutene material, a material comprising polyimide and epoxy, and a material comprising polyimide and silicone, to substantially fill the void.

In accordance with another aspect of the invention there is provided a process for mounting a semiconductor structure including the process above and further involving mounting the semiconductor structure to the carrier such that the solidified support material bears upon a portion of the carrier to permit the solidified support material to further support the semiconductor structure.

The semiconductor structure may include a substrate on which the semiconductor structure is formed and the process may involve removing the substrate after mounting the semiconductor structure to the carrier.

The semiconductor structure may include a mounting surface located on an opposite side of the semiconductor structure to the substrate and mounting may involve introducing a plurality of spaced apart metal bonding members between the mounting surface and the carrier, the metal bonding members being operable to bond the semiconductor structure to the carrier.

Causing the support material to substantially fill the void may involve causing a support material, which when solidified has a thermal expansion coefficient sufficiently similar to a thermal expansion coefficient of the metal bonding members, to substantially fill the void, such that thermal induced stresses in the semiconductor structure are minimized when a temperature of the semiconductor structure changes.

Introducing the plurality of metal bonding members may involve forming the bonding members on the mounting surface and causing the support material to substantially fill the void may further involve causing the support material to substantially fill spaces between the metal bonding members.

Introducing the plurality of metal bonding members may involve forming the bonding members on the carrier and the process may further involve causing a support material to substantially fill spaces between the metal bonding members and causing the support material to solidify sufficiently to support the semiconductor structure when mounted to the carrier.

Forming the plurality of metal bonding members may involve forming a plurality bonding members comprising gold.

In accordance with another aspect of the invention there is provided a semiconductor light emitting structure. The structure includes a first conductivity type semiconductor material, a second conductivity type semiconductor material, and a light emitting region disposed between the first conductivity type semiconductor material and the second conductivity type semiconductor material. The structure further includes at least one void in the semiconductor structure, the void being defined by surfaces formed in the semiconductor structure and a support material in the void, the support material being sufficiently solidified to support the semiconductor structure when mounted to a carrier and having a glass transition temperature greater than an operating temperature of the semiconductor light emitting apparatus.

In accordance with another aspect of the invention there is provided a semiconductor light emitting apparatus including the semiconductor structure above and further including a carrier, the semiconductor structure being mounted to the carrier such that the solidified support material bears upon a portion of the carrier to permit the solidified support material to further support the semiconductor structure.

Other aspects and features of the present invention will become apparent to those ordinarily skilled in the art upon review of the following description of specific embodiments of the invention in conjunction with the accompanying figures.

BRIEF DESCRIPTION OF THE DRAWINGS

In drawings which illustrate embodiments of the invention.

DETAILED DESCRIPTION

Figure 1:
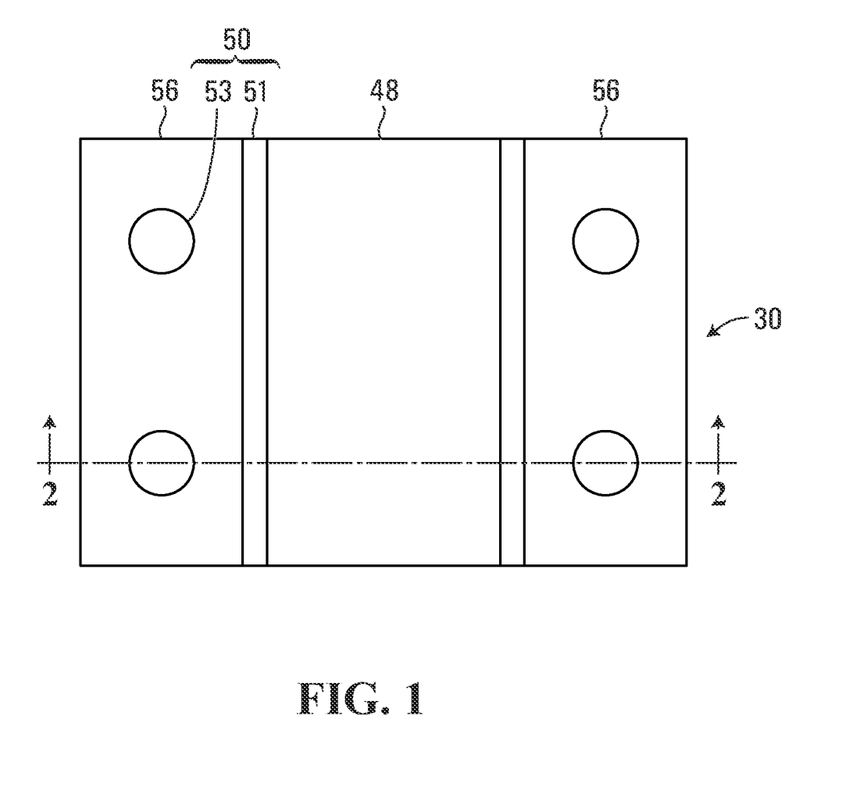
FIG. 1 is a schematic plan view of a semiconductor structure in accordance with a first embodiment of the invention.
Figure 2:
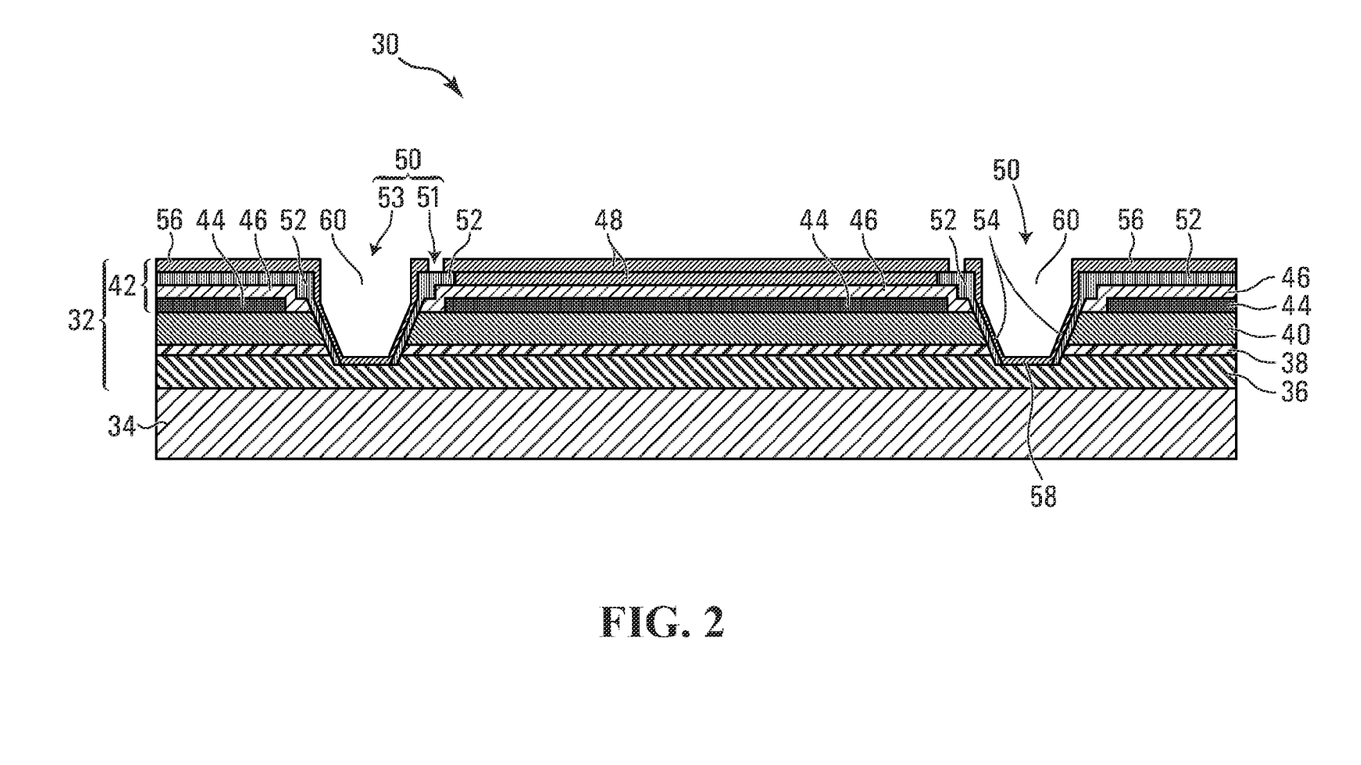
FIG. 2 is a schematic cross-sectional view of the semiconductor structure shown in FIG. 1 taken along the line 2-2.

Referring to FIG. 1 and FIG. 2, a semiconductor light emitting structure prepared for mounting by a process in accordance with an embodiment of the invention is shown generally at 30. The semiconductor structure 30 is shown in plan view in FIG. 1 and in cross sectional view in FIG. 2.

Referring to FIG. 2, the semiconductor structure 30 includes an epitaxial structure 32. The epitaxial structure 32 includes an n-type region 36, which is grown on the substrate 34. The epitaxial structure 32 further includes a light emitting region 38, grown on the n-type region 36, and a p-type region 40, which is grown on the light emitting region 38. In general the n-type region 36, the p-type region 40, and the light emitting region 38 may each include a plurality of layers of different composition and dopant concentration. In one embodiment, where it is desired to remove the substrate 34 after processing, the n-type region 36 may include a release layer (not shown) located between the n-type region and the substrate, for facilitating release of the substrate from the epitaxial structure 32.

The epitaxial structure 32 further includes a plurality of connection layers 42 deposited on the p-type region 40. The connection layers 42 are operable to provide electrical connection to the n-type region 36 and the p-type region 40. The connection layers 42 include a p-metal layer 44, which generally comprises a highly reflective metal, in electrical contact with the p-type region 40. The connection layers 42 further include an optional guard metal layer 46 deposited over the p-metal layer 44. The guard metal layer 46 may be used, for example, when the p-metal layer 44 comprises silver, in which case the guard metal layer is included to prevent silver from migrating to other parts of the epitaxial structure 32. The guard metal layer 46 is in electrical contact with the p-metal layer 44.

The connection layers 42 further include one or more p-electrode metal layers 48, deposited over the guard metal layer 46 and in electrical connection therewith.

The epitaxial structure 32 further includes one or more voids 50. The voids 50 may include, for example, one or more vias 53 for providing electrical connection to the n-type region 36. In the embodiment shown, the via 53 extends through the p-type region 40, the light emitting region 38, and into the n-type region 36. The via 53 is defined by side wall surfaces 54 and a bottom wall surface 58.

The epitaxial structure 32 also includes a dielectric layer 52 deposited over the guard metal layers 46 and side wall surfaces 54 of the vias 53. The epitaxial structure 32 also includes an n-electrode metal layer 56 deposited over the dielectric layer 52 and the bottom wall surface 58 of the via 53. The n-electrode layer 56 at the bottom wall surface 58 of the via 53 is in electrical connection with the n-type region 36, and provides an electrical connection thereto. The dielectric layer 52 electrically insulates the n-electrodes 56 from the p-electrode 48, the guard metal layer 46, and the p-type region 40.

The voids 50 may further include a trench 51, which is operable to electrically insulate the p-electrode 48 from the n-electrodes 56. Referring to FIG. 1, the trench 51 extends across the semiconductor structure 30, which further includes four vias 53. The voids 50 (including the trench 51 and vias 53) weaken the semiconductor structure 30, making the structure susceptible to damage during mounting and/or operation.

Figure 3:
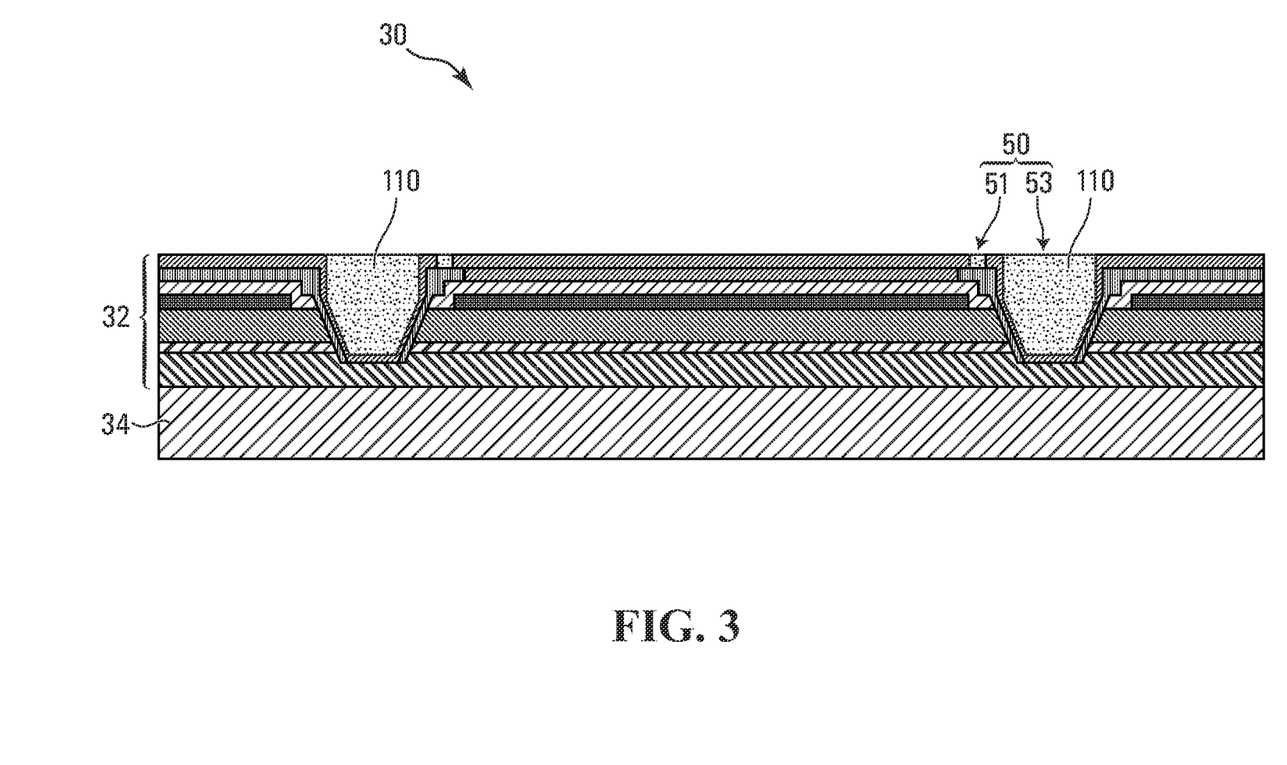
FIG. 3 is a further schematic cross-sectional of the semiconductor structure shown in FIG. 2.

Referring to FIG. 3, a support material 110 substantially fills the voids 50. The support material 110 is sufficiently solidified to support the semiconductor structure 30 during mounting and/or operation. In one embodiment the support material 110 has a glass transition temperature greater than an operating temperature of the semiconductor light emitting structure 30, such that the support material remains sufficiently rigid to support the semiconductor structure when operating to generate light.

Figure 4:
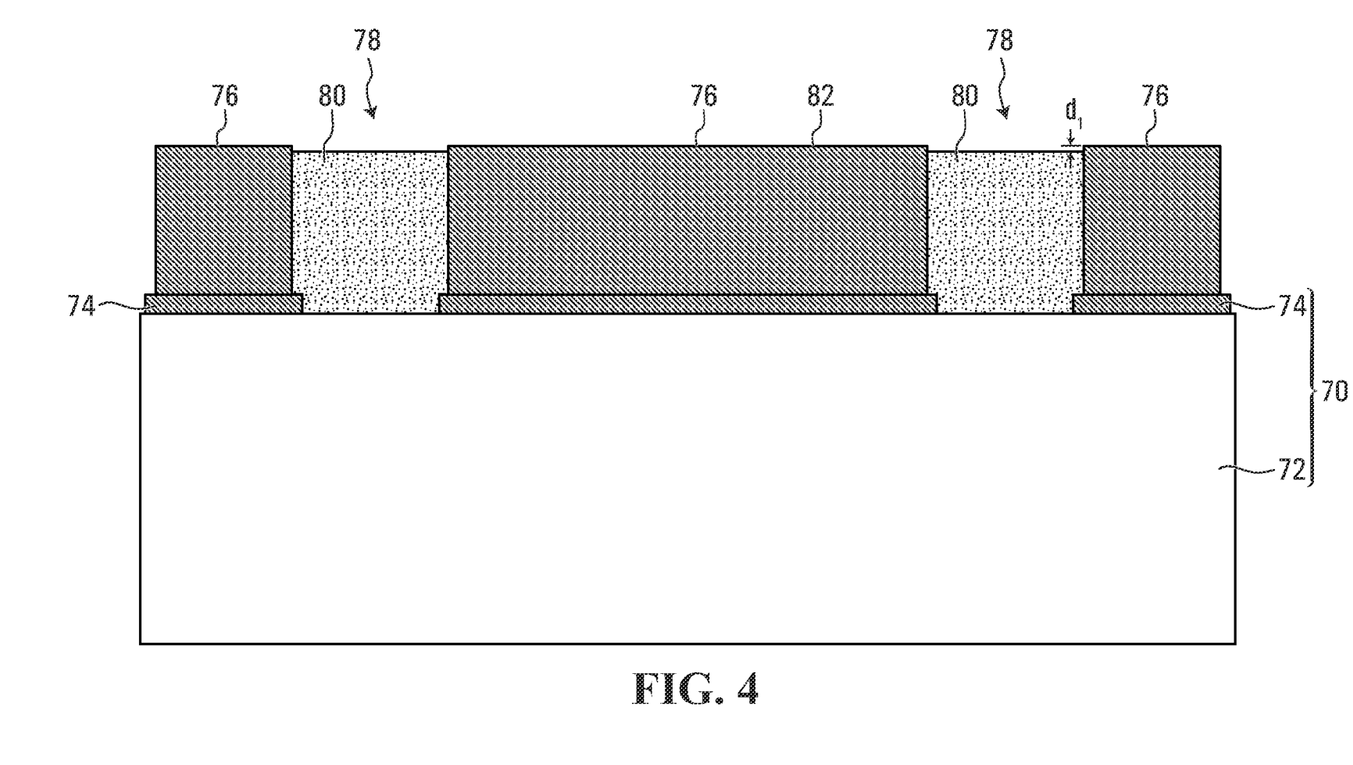
FIG. 4 is a schematic cross-sectional view of a carrier for mounting the semiconductor light emitting apparatus shown in FIG. 3.

Referring to FIG. 4, a first embodiment of a carrier for mounting the semiconductor structure 30 (shown in FIG. 3) is shown generally at 70. The carrier 70 includes a substantially rigid base 72, which may be an aluminum nitrite ceramic or an alumina ceramic material. The carrier 70 further includes a plurality of electrical contact areas 74, which are deposited on the base 72. In this embodiment, a plurality of spaced apart metal bonding members 76 are deposited on the electrical contact areas 74. The electrical contact areas 74 and the metal bonding members 76 may include gold or a gold/titanium alloy, for example.

In the embodiment shown in FIG. 4, spaces 78 between the metal bonding members 76 are filled with a support material 80. The support material 80 is slightly recessed by an amount $d_1$ with respect to an outer surface 82 of the metal bonding members 76. Recessing the support material 80 allows for some deformation of the metal bonding members 76 during mounting without compressing the support material or causing it to flow out of the spaces 78.

Figure 5:
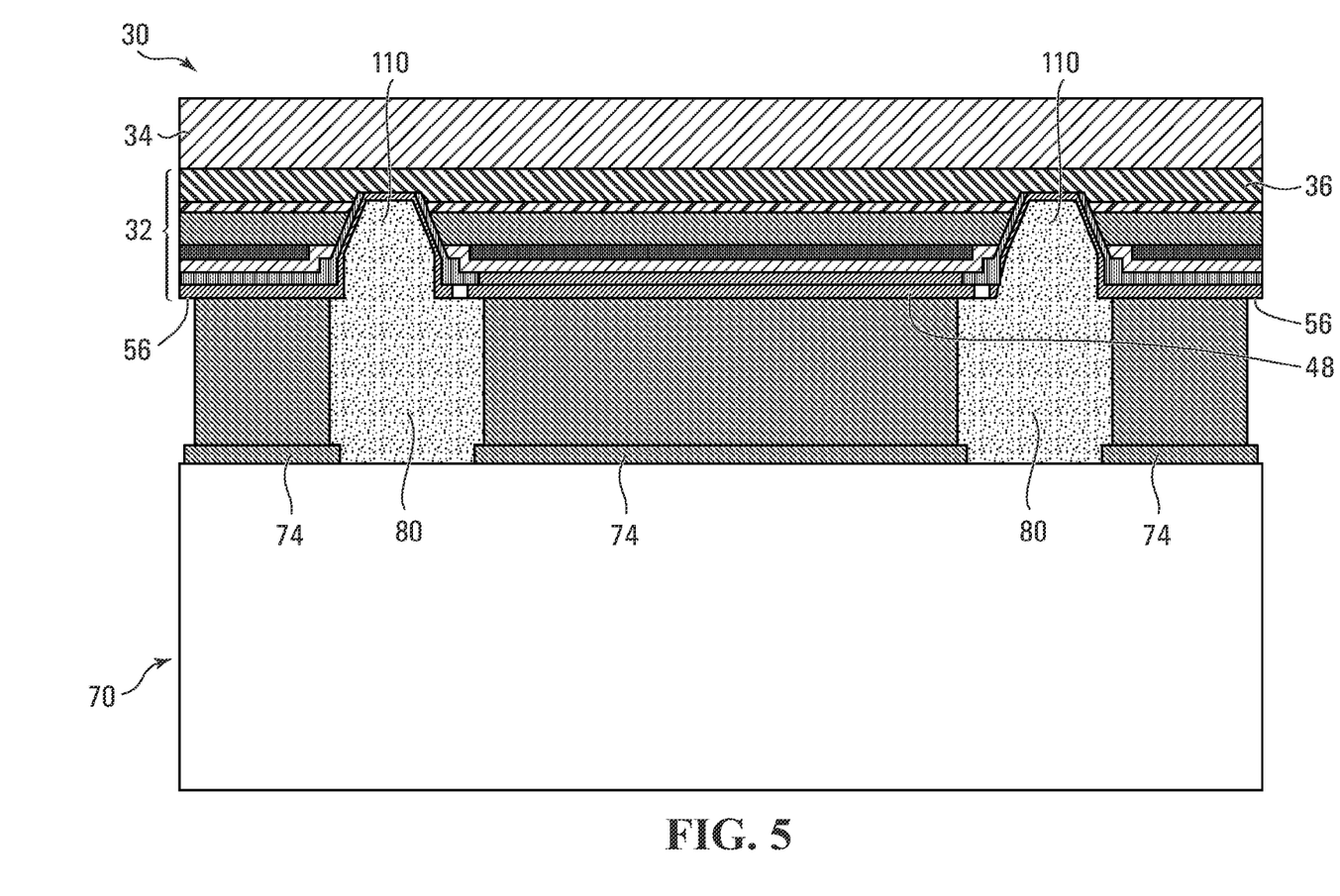
FIG. 5 is a schematic cross-sectional view of a semiconductor light emitting apparatus including the semiconductor structure shown in FIG. 3 mounted to the carrier shown in FIG. 4.

Referring to FIG. 5, the semiconductor structure 30 is shown mounted to the carrier 70. The n-electrodes 56 and the p-electrode 48 act as mounting surfaces for mounting the semiconductor structure 30 to the carrier 70. The embodiment shown in FIG. 5 is generally referred to as "flip-chip mounting", since the semiconductor structure 30 is flipped over and mounted with the epitaxial structure 32 towards the carrier 70 (In flip-chip mounting, the metal bonding members 76 are commonly referred to as bumps or stud bumps). The support material 110 and 80 is sufficiently solidified to support the semiconductor structure 30, when mounted as shown in FIG. 5. The support material 80 also bears on upon a portion of the carrier 70 to permit the support material to further support the semiconductor structure 30.

The electrical contact areas 74 facilitate electrical connection to the p-electrode 48 and the n-electrodes 56, for providing an excitation signal to the structure. When a forward bias voltage is applied (i.e., the p-electrode 48 is made more positive than the n-electrode 56) a forward bias current flows through the p-type region 40, the light emitting region 38, and the n-type region 36, and photons are generated in the light emitting region. The photons are incident in all directions, and photons that are incident on the reflective p-metal layer 44 are reflected back through the p-type region 40, the light emitting region 38, and the n-type region 36 and are emitted through the substrate 34.

In some embodiments the substrate 34 may have a refractive index that does not closely match the refractive index of the epitaxial structure 32, in which case light coupling through the substrate 34 may be compromised. In such cases in may be desirable to remove the substrate 34 after mounting the semiconductor structure 30 to the carrier 70. In embodiments where the substrate 34 is subsequently removed from the semiconductor structure 30, photons reflected from the p-metal layer 44, and other photons that are directly incident on the n-type region 36, pass through the n-type region, and are emitted as light therefrom.

Figure 6:
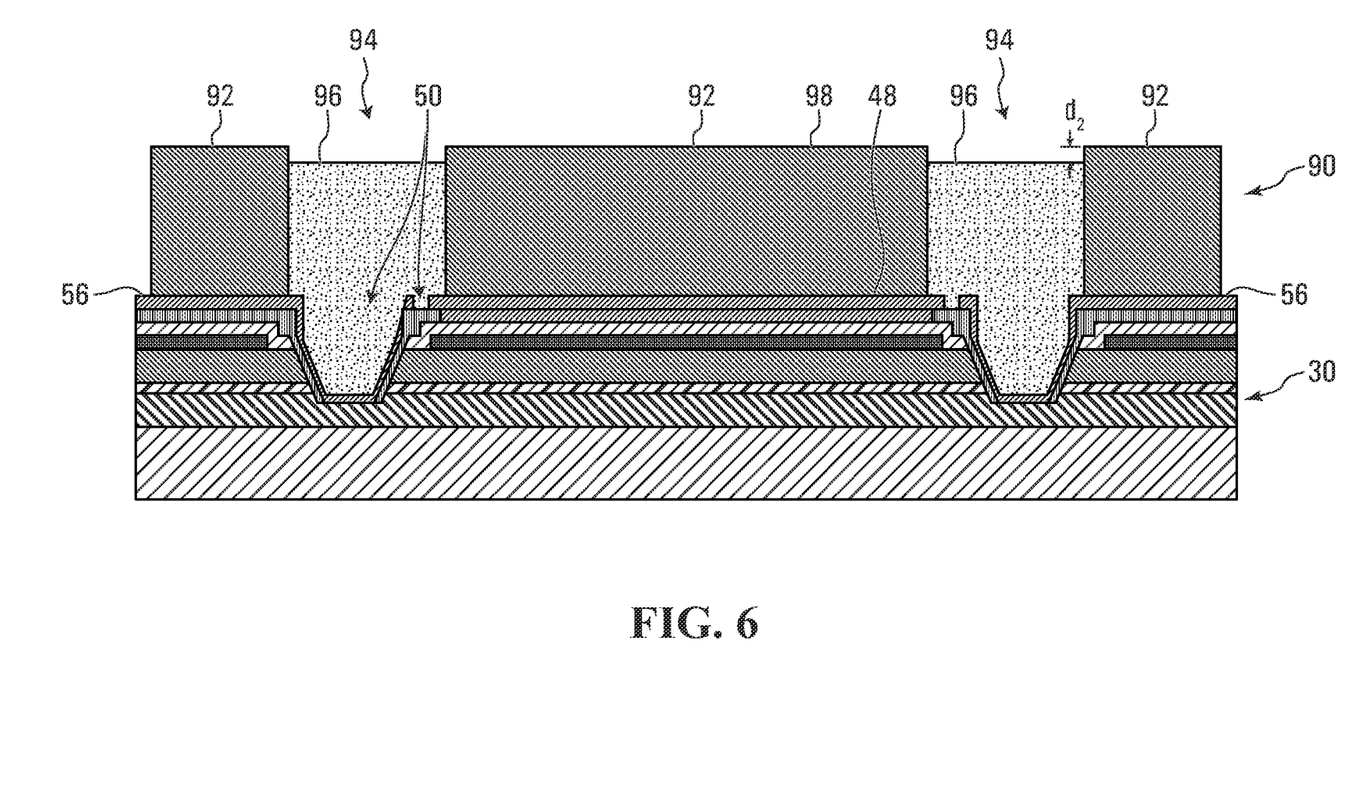
FIG. 6 is a schematic cross-sectional view of a semiconductor structure in accordance with an alternate embodiment of the invention.

Referring to FIG. 6, a semiconductor structure in accordance with an alternative embodiment of the invention is shown generally at 90. The semiconductor structure 90 includes the semiconductor structure 30 shown in FIG. 3, and further includes a plurality of metal bonding members 92 deposited on the n-electrodes 56, and the p-electrode 48. The n-electrodes 56 and the p-electrode 48 act as mounting surfaces for the metal bonding members 92. In the embodiment shown, a support material 96 fills the voids 50 and a space 94 between the metal bonding members 92. The support material 96 is recessed with respect to an outer surface 98 of the metal bonding members 92 by an amount $d_2$. Recessing the support material 96 allows for some deformation of the metal bonding members 92 when mounting the semiconductor structure 90.

Figure 7:
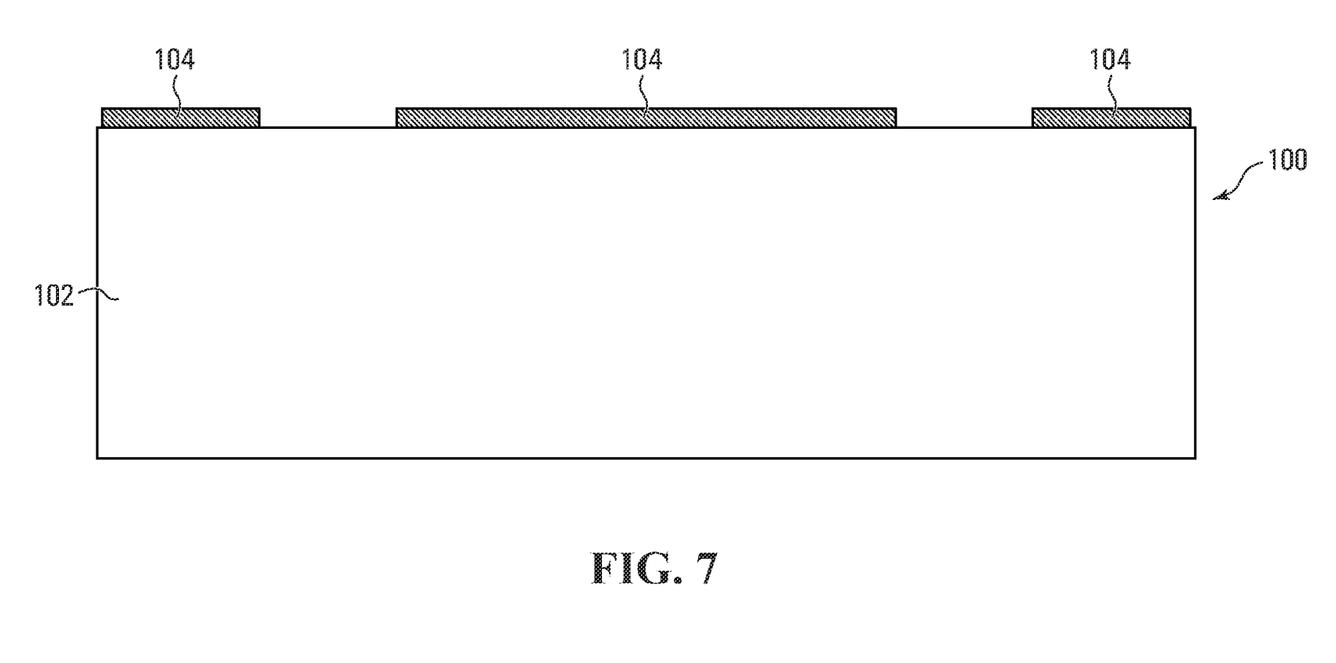
FIG. 7 is a schematic cross-sectional view of a carrier for mounting the semiconductor structure shown in FIG. 6.

Referring to FIG. 7, a carrier for mounting the semiconductor structure 90 (shown in FIG. 6) is shown generally at 100. The carrier 100 includes a base 102 and a plurality of electrically conductive areas 104 which act as mounting surfaces for mounting the semiconductor structure 90. The semiconductor structure 90 is flipped over and mounted to the carrier 100 to provide a semiconductor light emitting device similar to that shown in FIG. 5.

In one embodiment the selected support material (110, 80, or 96) is a material having a glass transition temperature above an operating temperature of the semiconductor structure when the structure is operating as a semiconductor light emitting apparatus. The glass transition temperature of a material is a temperature below which molecules of the material have relatively little mobility, and thus the material is in a substantially rigid state below its glass transition temperature. For example, in a semiconductor light emitting apparatus having a normal operating junction temperature in the region of 185° C., a suitable support material may have a glass transition temperature of 195° C. or greater.

It may also be desirable to select a support material having a thermal expansion coefficient which is sufficiently similar to a thermal expansion coefficient of the metal bonding members 76 or 92. Approximate matching of the thermal expansion coefficients reduces thermal induced stresses when the temperature of the semiconductor junction changes, thus potentially avoiding catastrophic failure of the semiconductor light emitting apparatus due to fracture, for example.

In some embodiments the selected support material may also act as a passivation layer, preventing contamination of the semiconductor structure during subsequent processing steps. For example, the passivation layer may be operable to protect the semiconductor structure from chemicals used during photoelectrical chemical etching processes.

Additionally, when selecting a support material, it may also be desirable to select a material that is resistant to degradation by exposure to wavelengths of light generated in the semiconductor light emitting apparatus. For example, some materials are particularly susceptible to degradation in ultraviolet light, and where the wavelength of the semiconductor light emitting device is in the ultraviolet range, a support material that is suitable for use in ultraviolet light applications may be selected.

Examples of suitable support materials include a polyimide material which generally has a glass transition temperature of over 300° C. and is more stable than epoxies and/or silicone underfills at high temperatures. Other examples of suitable materials may include benzocyclobutene materials. The support material may also comprise a hybrid material comprising polyimide and epoxy or polyimide and silicon.

A process for preparing a semiconductor structure for mounting in accordance with one aspect of the invention is described with reference to FIG. 2, FIG. 8, and FIG. 9 Referring to FIG. 2, the semiconductor structure 30 is generally fabricated by epitaxial growth of the epitaxial structure 32 on the substrate 34. The semiconductor structure 30 is shown on FIG. 2 after forming surfaces defining the voids 50 (for example the side wall surfaces 54 and the bottom wall surface 58 of the vias 53). The semiconductor structure 30 shown in FIG. 2 is at least initially supported by the substrate 34 which provides support to the structure during processing and helps to prevent fracture etc.

Figure 8:
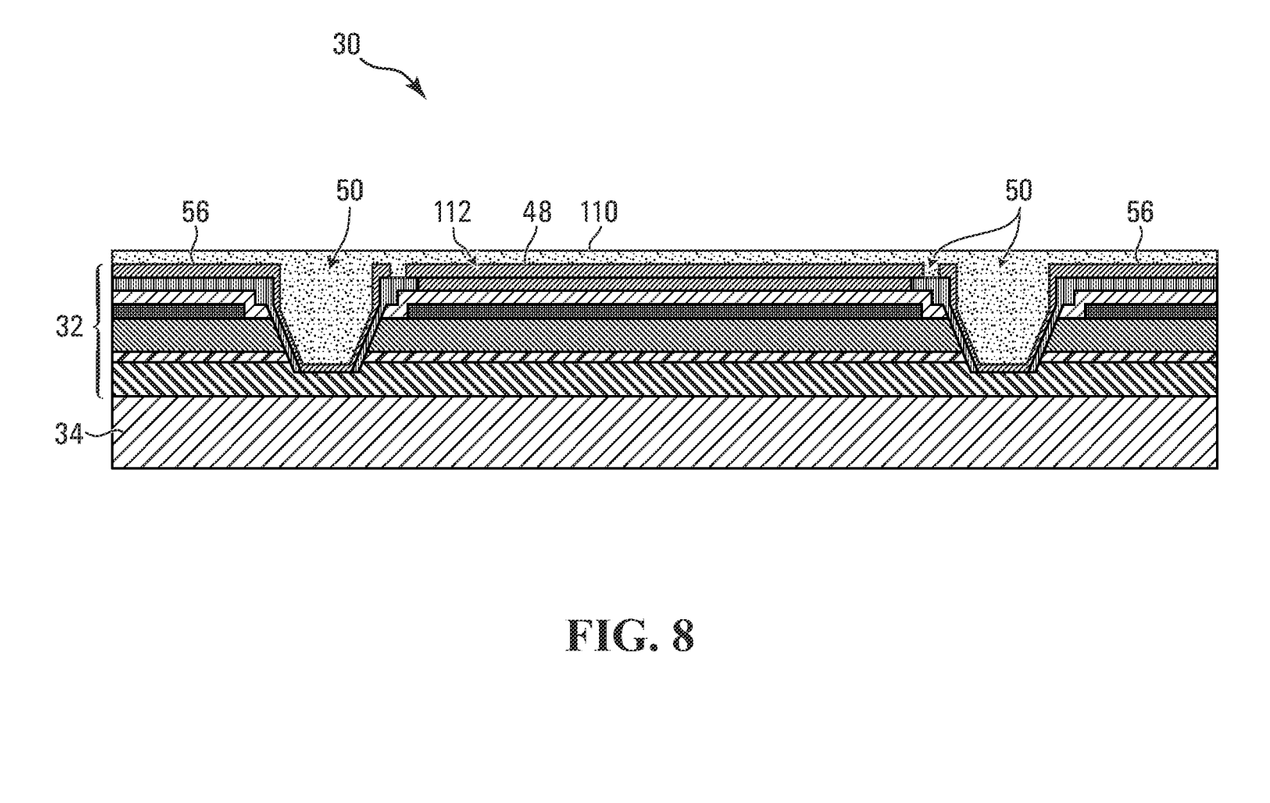
FIGS. 8 & 9 are schematic cross-sectional views illustrating processing of a semiconductor structure in accordance with an embodiment of the invention.

Referring to FIG. 8, the support material 110 is then deposited over the semiconductor structure 30. In the embodiment shown the support material 110 overfills the voids 50 and covers at least a portion of an upper surface 112 of the epitaxial structure 32. The support material 110 may be deposited by spin coating a wafer (not shown) including a plurality of semiconductor structures 30. Spin coating involves depositing more than a sufficient quantity of a fluid support material 110, and then spinning the wafer to cause the fluid to form a thin coating over the wafer. Spinning continues until the coating has sufficiently cured through evaporation of solvents, for example. The support material 110 may then be further cured by baking the wafer in an oven to raise the temperature above a support material cure temperature to solidify the support material sufficiently to support the semiconductor structure 30.

Figure 9:
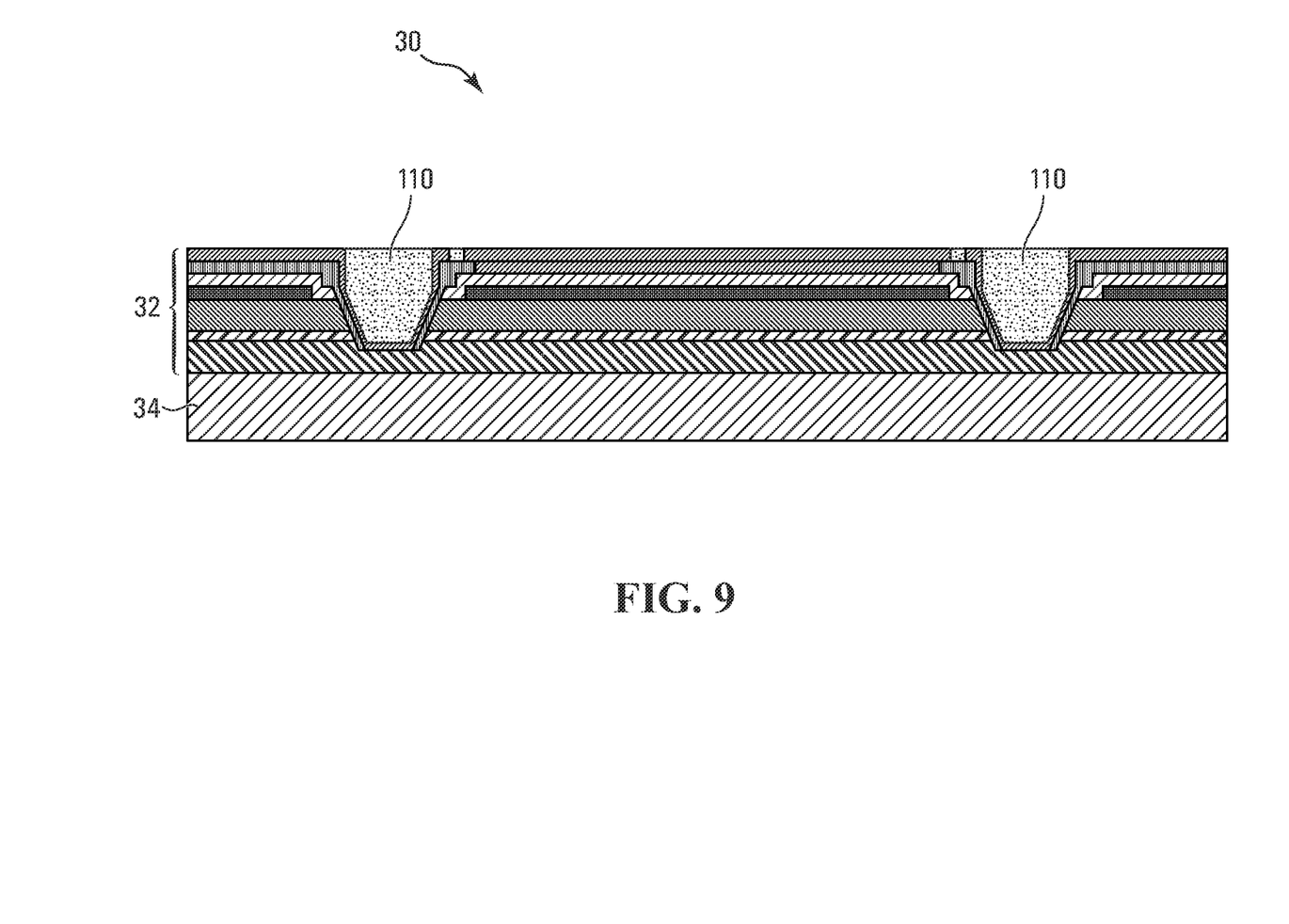

Referring to FIG. 9, in the embodiment shown the process continues by planarizing the wafer. Planarizing may involve mechanical process steps such as lapping the wafer to abrade away excess support material 110. In one embodiment lapping may remove a portion of the n-electrode layer 56 and the p-electrode 48, to provide a substantially flat mounting surface.

Lapping processes generally roughen the lapped surfaces, and in one embodiment lapping may further be followed by a polishing process to remove some surface roughness due to the lapping, and to further condition the mounting surfaces for the mounting process.

Alternatively or additionally, lapping and/or polishing may be followed by an etch process to remove a portion of the upper surface 112, thus exposing a clean surface for mounting. The etch process may be a plasma etch process. In general the plasma etch process is performed in combination with a mechanical process to planarize the wafer to a sufficient degree to facilitate mounting. The mechanical process steps provide improved bonding reliability over a plasma etch alone, when mounting the semiconductor structure 30.

The resulting planarized semiconductor structure 30 in FIG. 9 is shown ready for further processing. Such further processing may involve, for example, mounting to a carrier such as that shown in FIG. 4, and may include a substrate removal process. Substrate removal may be performed by laser dissociation, for example, and is described in greater detail in commonly assigned U.S. patent application Ser. No. 11/149,679 entitled "Method of Removing the Growth Substrate of a Semiconductor Light Emitting Device", filed on Jun. 9, 2005, and which is incorporated herein by reference.

Advantageously the semiconductor structure 30 shown in FIG. 9, is supported by the support material 110 and the epitaxial structure 32 may be separated from the substrate 34, after mounting, without substantial risk of damaging the epitaxial structure.

Referring back to FIG. 4, the carrier 70 may be processed in a similar manner to the structure 30, by spin coating a support material 80 onto the carrier and then causing the support material to solidify. In one embodiment the semiconductor structure 30 is bonded to the carrier 70 using a thermosonic bonding process. Thermosonic bonding involves subjecting the structure 30 and the carrier 70 to ultrasonic vibration while being heated, thus causing an improved bond. The metal bonding members 76 may be deformed slightly under the bonding forces during mounting. Accordingly, in this embodiment the support material 80 may be spin coated such that the support material becomes recessed slightly below the outer surface 82 of the metal bonding members 76.

Referring to FIG. 6, in the alternative embodiment shown, the support material 96 may be applied in a very similar manner to that described in connection with the carrier 70, including recessing of the support material below the outer surface 98 of the metal bonding members 92.

Referring back to FIG. 2, in other embodiments the n-type region 36 and the p-type region 40 may be reversed in location, such that the p-type region is epitaxially grown on the substrate 34. In general semiconductor light emitting structures include a first conductivity type semiconductor material region and the second conductivity type semiconductor material region and the first conductivity type region generally includes one of an n-type or p-type semiconductor material while the second conductivity type region includes the other of the n-type or p-type semiconductor material.

While specific embodiments of the invention have been described and illustrated, such embodiments should be considered illustrative of the invention only and not as limiting the invention as construed in accordance with the accompanying claims.

What is claimed is:

1. A device comprising:
   a semiconductor structure comprising:
      a light emitting layer disposed between an n-type region and a p-type region;
      a plurality of voids extending into the n-type region, the light emitting layer, and the p-type region of the semiconductor structure;
      an n-electrode metal disposed in the plurality of voids, wherein the n-electrode metals extends to an edge of the device;
      a reflective metal disposed on the p-type region;
      a p-electrode metal disposed on the reflective metal; and
   a support material disposed in the plurality of voids, wherein a surface of the device is planar, wherein the planar surface of the device includes a surface of the support material, a surface of the n-electrode metal, and a surface of the p-electrode metal.

2. The device of claim 1, further comprising:
   a trench disposed between the n-electrode metal and the p-electrode metal, wherein the trench is filled with the support material.

3. The device of claim 1 wherein the support material comprises one of a polyimide material, a benzocyclobutene material, a material comprising polyimide and epoxy, and a material comprising polyimide and silicone.

4. The device of claim 1 wherein the support material is sufficiently solid to support the semiconductor structure when mounted to a carrier.

5. The device of claim 1 wherein the support material has a glass transition temperature greater than an operating temperature of the semiconductor structure.

6. The device of claim 1 wherein the support material has a glass transition temperature of at least 195 degrees Celsius.

7. The device of claim 1 wherein the support material acts as a passivation layer, the passivation layer being operable to prevent contamination of the semiconductor structure.

8. The device of claim 1 further comprising:
a carrier, wherein the semiconductor structure is mounted to the carrier via the planar surface such that the support material bears upon a portion of the carrier to permit the support material to further support the semiconductor structure.

9. The device of claim 1 wherein the support material has a thermal expansion coefficient sufficiently similar to a thermal expansion coefficient of the n-electrode metal and the p-electrode metal, such that thermal induced stresses in the semiconductor structure are minimized when a temperature of the semiconductor structure changes.

10. The device of claim 1 wherein a portion of the n-electrode metal that extends to an edge of the device is disposed over a portion of the reflective metal.

11. The device of claim 1 wherein the p-electrode metal is disposed in a center of the device between two portions of the n-electrode metal that extend to first and second edges of the device.

12. The device of claim 1 further comprising:
a plurality of metal bonding members deposited on the n-electrode metal and the p-electrode metal; and
an additional support material disposed in a space between the plurality of metal bonding members.

13. The device of claim 12 wherein the additional support material is recessed with respect to an outer surface of the plurality of metal bonding members.

14. A method comprising:
forming a plurality of voids extending into an n-type region, a light emitting layer, and a p-type region of a semiconductor structure in a device, wherein the light emitting layer is disposed between the n-type region and the p-type region;
disposing an n-electrode metal in the plurality of voids, wherein the n-electrode metal extends to an edge of the device;
disposing a reflective metal on the p-type region;
disposing a p-electrode metal on the reflective metal;
disposing a support material in the plurality of voids; and
forming a planar surface of the device, wherein the planar surface of the device includes a surface of the support material, a surface of the n-electrode metal, and a surface of the p-electrode metal.

15. The method of claim 14, further comprising:
forming a trench between the n-electrode metal and the p-electrode metal; and
filling the trench with the support material.

16. The method of claim 14 wherein the support material comprises one of a polyimide material, a benzocyclobutene material, a material comprising polyimide and epoxy, and a material comprising polyimide and silicone.

17. The method of claim 14, further comprising:
mounting the semiconductor structure on a carrier such that the support material is in contact with the carrier.

18. The device of claim 1 wherein the plurality of voids extend through the p-type region and the light emitting layer and end in the n-type region, such that the plurality of voids do not extend through an entire thickness of the semiconductor structure.

* * * * *